United States Patent [19]

Kitahara

[11] Patent Number: 4,588,942
[45] Date of Patent: May 13, 1986

[54] THICKNESS MONITORING SYSTEM FOR INTERMITTENTLY EXPOSING A QUARTZ CRYSTAL TO A MATERIAL TO BE DEPOSITED

[75] Inventor: Hiroaki Kitahara, Tokyo, Japan

[73] Assignee: Anelva Corporation, Tokyo, Japan

[21] Appl. No.: 503,041

[22] Filed: Jun. 10, 1983

[30] Foreign Application Priority Data

Jun. 11, 1982 [JP] Japan ................. 57-100416

[51] Int. Cl.$^4$ ............... G01N 27/07; C23C 14/52
[52] U.S. Cl. ......................... 324/71.5; 204/298
[58] Field of Search ............ 324/71.1, 71.5, 56; 118/713, 663, 664, 665, 715; 427/9, 10; 204/298

[56] References Cited

U.S. PATENT DOCUMENTS 3,063,867 11/1962 Emery, Jr. .................. 427/9
4,121,537 10/1978 Maruyama ................. 118/7
4,362,125 12/1982 Schadler .................. 118/712
4,378,382 3/1983 Behn ...................... 427/9

Primary Examiner—Reinhard J. Eisenzopf
Assistant Examiner—G. Peterkin
Attorney, Agent, or Firm—Laff, Whitesel, Conte & Saret

[57] ABSTRACT

In a thickness monitoring system for use in monitoring a thickness of a desired layer to be deposited on a substrate placed on a first electrode member in a hollow space, a quartz crystal is intermittently exposed to a flow of particles sputtered or otherwise traveling from a second electrode member opposite to the first electrode member. For this purpose, a shutter may be placed in front of the quartz crystal and periodically put into operation to shelter the quartz crystal from the second electrode member. When the first electrode member has a rotatable cylinder, the quartz crystal may be placed within an inside hollow space of the cylinder. At least one hole is distributed on the cylinder to allow the material flow to intermittently pass therethrough towards the quartz crystal. When the first electrode member has a rotatable disk, the quartz crystal may be placed backwardly of the disk and is exposed to the second electrode member through at least one aperture formed in the disk.

5 Claims, 7 Drawing Figures

4,588,942

THICKNESS MONITORING SYSTEM FOR INTERMITTENTLY EXPOSING A QUARTZ CRYSTAL TO A MATERIAL TO BE DEPOSITED

BACKGROUND OF THE INVENTION

This invention relates to a thickness monitoring system for use in combination with a layer forming device operable to form a layer on a substrate in a hollow space. It should be noted here that the layer forming device may be a sputtering device, an evaporation device, an ion plating device, or the like, although the sputtering device will mainly be described throughout the instant specification.

A sputtering device of the type described comprises a pair of electrode members which are opposite to each other in a hollow space and one of which serves to support a substrate thereon and the other of which comprises a conductive plate and a target plate of a material to be sputtered onto the substrate. An a.c. voltage is often supplied between the electrode member pair to cause sputtering of the target material towards the substrate. As a result, a desired layer of the target material is deposited on the substrate. Such an a.c. voltage has a high frequency selected between several hundreds of kilohertz and several tens of megahertz.

In the meantime, it is preferable with a layer forming device, such as a sputtering device, that a thickness of the layer must always be monitored by the use of a thickness monitoring system during the sputtering. The thickness monitoring system often comprises a quartz crystal exposed in the hollow space to a flow of the target material and coated with a monitoring layer of the target material, simultaneously with the deposition of the layer on the substrate. The quartz crystal covered with the monitoring layer has a variable resonance frequency dependent on a variation of weight of the monitoring layer, as known in the art. Therefore, it is possible to detect the thickness of the layer deposited on the substrate, by monitoring a variation of the high frequency produced from the quartz crystal.

When the quartz crystal is applied to the sputtering device driven by such high frequency a.c. voltage, the quartz crystal is adversely affected by the high frequency. As a result, it is difficult to accurately monitor the thickness with the quartz crystal because a result of measurement is inevitably accompanied by an error.

Preferably, such a thickness monitoring system is available to various types of sputtering devices each of which is driven by the high frequency a.c. voltage.

SUMMARY OF THE INVENTION

It is an object of this invention to provide a thickness monitoring system which is capable of monitoring a thickness of a layer at a high precision and a high reliability.

It is another object of this invention to provide a thickness monitoring system which is applicable to various types of layer forming devices.

A thickness monitoring system to which this invention is applicable is for use in combination with a layer forming device which deposits a desired layer on a substrate in a hollow space filled with a gas. The thickness monitoring system is for monitoring a thickness of the layer during the deposition. The layer forming device comprises a first electrode member on which the substrate is supported in the hollow space, a second electrode member opposite to the first electrode member in the hollow space, and means for supplying an electric voltage between the first and the second electrode members. According to this invention, the monitoring system comprises a quartz crystal covered in the hollow space with a monitoring layer having a variable thickness for producing an electric signal specifying a frequency variable in correspondence to the thickness of the monitoring layer, thickness detecting means responsive to the electric signal for detecting the thickness of the desired layer with reference to the thickness of the monitoring layer, and exposure means for intermittently exposing the quartz crystal to the second electrode member.

DESCRIPTION OF THE PREFERRED EMBODIMENTS

Figure 1:
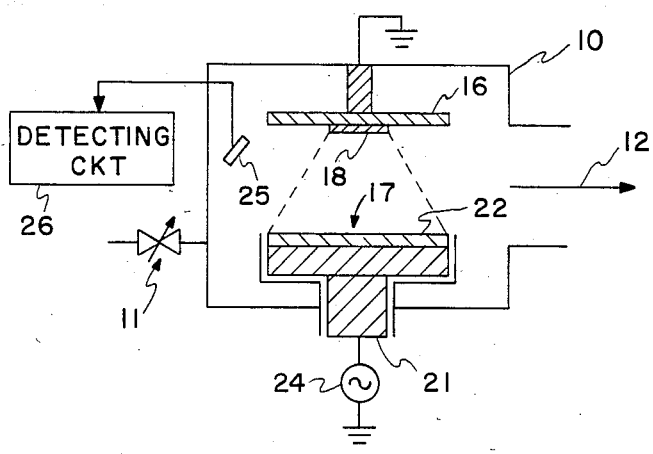
FIG. 1 shows a block diagram of a conventional thickness monitoring system for use in combination with a sputtering device.

Referring to FIG. 1, a conventional monitoring system is for use in combination with a sputtering device. The sputtering device comprises a chamber 10 defining a hollow space therein, a gas introducing system (symbolically depicted at 11) for introducing a gas, such as argon, into the hollow space, and a gas exhausting system 12 for exhausting the hollow space. In the hollow space, the sputtering device comprises a first electrode member 16 grounded and a second electrode member 17 opposite to the first electrode member 16. The first electrode member 16 has a flat principal surface facing the second electrode member 17. A plurality of substrates may be supported on the flat principal surface and directed towards the second electrode member 17, although a single substrate 18 alone is illustrated in FIG. 1. Thus, the first electrode member 16 serves as a substrate holder for holding the substrate 18. The second electrode member 17 comprises a conductive plate 21 and a target 22 of a material to be deposited on the substrates 18. The target 22 is placed on the conductive plate 21 and directed towards the first electrode member 16.

An electric voltage source 24 is connected between the first and the second electrode members 16 and 17 to produce an a.c. voltage of high frequency selected between several hundreds of kilohertz and several tens of megahertz. A glow discharge takes place in the hollow space between the first and the second electrode members 16 and 17 by supply of the a.c. voltage. Ions and electrons result from the glow discharge and sputter the target material onto the substrate 18. The target material reaches the substrate 18 in the form of a flow of particles. As a result, a desired layer of the target material is deposited on the substrate 18.

The monitoring system comprises a quartz crystal thickness sensor, namely, a quartz crystal 25 directed to the second electrode member 17 in the hollow space outside a limited space (shown by dashed lines) between the substrate 18 and the second electrode member 17. During the sputtering, the target material reaches not only the substrate 18 but also to the quartz crystal 25. As a result, the quartz crystal 25 is covered with a layer which may be called a monitoring layer. The monitoring layer becomes gradually thick and heavy as deposition of the target material progresses. Thus, the quartz crystal 25 covered with the monitoring layer gradually becomes thick and heavy in weight.

It is known in the art that a quartz crystal has a resonance frequency proportional to a variation of the weight thereof. Therefore, it is possible to detect a thickness of the monitoring layer by monitoring a variation of the resonance frequency of the crystal quartz 25 covered with the monitoring layer.

The desired layer on the substrate 18 becomes thick in proportion to the thickness of the monitoring layer on the quartz crystal 25. Therefore, a thickness of the desired layer can be detected or measured by monitoring the thickness of the monitoring layer.

Under these circumstances, the quartz crystal 25 supplies a detecting circuit 26 with an electric signal representative of the resonance frequency of the quartz crystal 25 with the monitoring layer. The electric signal therefore specifies a frequency variable in correspondence to the thickness of the monitoring layer. The detecting circuit 26 detects, as a result of measurement, the thickness of the desired layer with reference to the thickness of the monitoring layer.

With this thickness monitoring system, the high frequency is objectionably given from the second electrode member 17 to the quartz crystal 25. The thickness monitoring system is disadvantageous in that the result of measurement is adversely affected by the high frequency of the voltage source 24, as described in the preamble of the instant specification.

Figure 2:
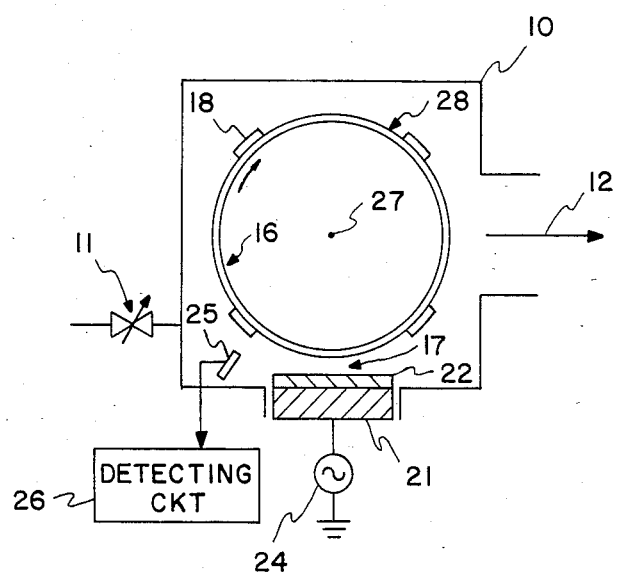
FIG. 2 shows a block diagram of the conventional thickness monitoring system applied to another sputtering device.

Referring to FIG. 2, the conventional thickness monitoring system is applied to another sputtering device. The system of FIG. 2 identifies similar parts by like reference numerals. The illustrated first electrode member 16 has an axis 27 and a cylinder 28 rotatable around the axis 26. The cylinder 28 has an outside cylindrical surface on which four of the substrates 18 are supported with an angle substantially azimuthally equally spaced between the two adjacent substrates. Each of the substrates 18 is successively directed towards the target 22 when the cylinder 28 is rotated in a direction depicted at an arrow-headed curve. The desired layer is formed on each substrate 18 when the sputtering of the target material is caused to occur by supply of the a.c. voltage.

The thickness monitoring system comprises the quartz crystal 25 covered with the monitoring layer during the sputtering and the detecting circuit 26 for detecting the thickness of the desired layer on each substrate 18 with reference to the thickness of the monitoring layer deposited on the quartz crystal 25.

The conventional monitoring system is disadvantageous, as is the case with that illustrated in FIG. 1.

Figure 3:
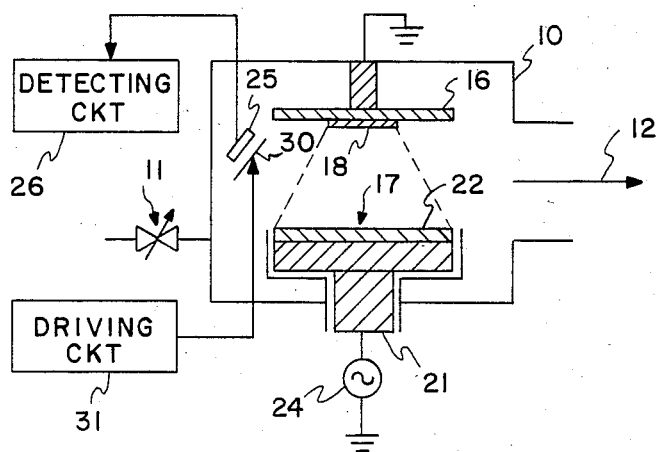
FIG. 3 shows a block diagram of a thickness monitoring system according to a first embodiment of this invention, together with a sputtering device similar to that illustrated in FIG. 1.

Referring to FIG. 3, a thickness monitoring system according to a first embodiment of this invention is for use in combination with a sputtering device similar to that illustrated in FIG. 1. The thickness monitoring system comprises a quartz crystal 25 placed outside a limited space (depicted by dashed lines) defined between the substrate 18 and the second electrode member 17 and a detecting circuit 26 connected to the quartz crystal 25, like in FIG. 1. The detecting circuit 26 is operable in a manner to be described in conjunction with FIG. 4.

A shutter 30 is placed intermediate between the quartz crystal 25 and the second electrode member 17 in the proximity of the quartz crystal 25. The shutter 30 may be operated in a sliding or a rotational manner. The shutter 30 is periodically driven by a driving circuit 31 to intermittently expose the quartz crystal 25 to the second electrode member 17. In other words, a combination of the shutter 30 and the driving circuit 31 serves to periodically shelter the quartz crystal 25 form the second electrode member 17. For this purpose, the shutter 30 is repeatedly and periodically closed and opened by the driving circuit 31.

Figure 4:
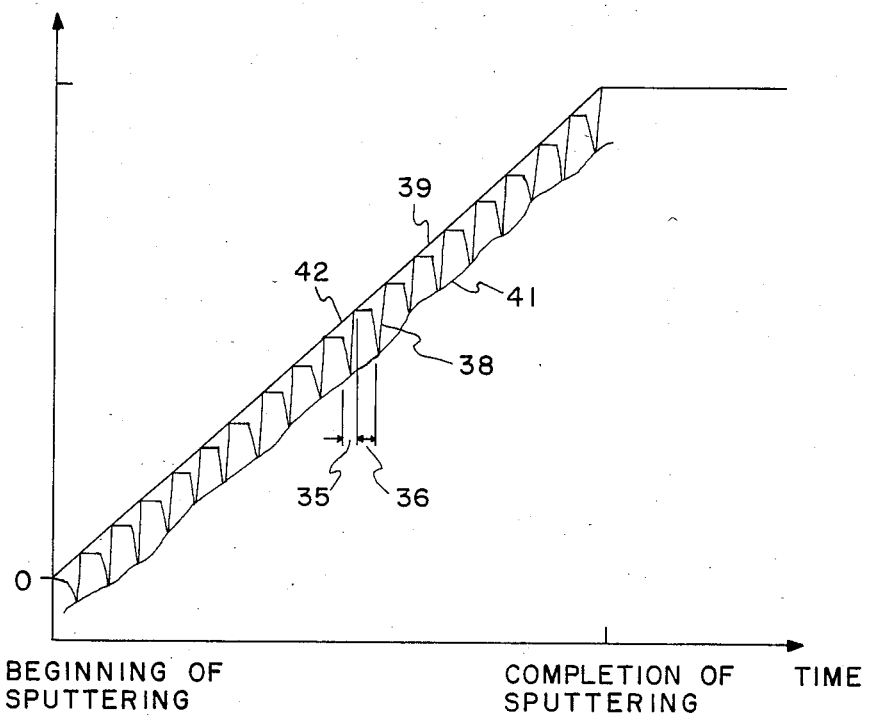
FIG. 4 shows a graphical representation for describing operation of the thickness monitoring system illustrated in FIG. 3.

Referring to FIG. 4 afresh and FIG. 3 again, the shutter 30 is opened during each of first time intervals, indicated at 35, and closed during each of second time intervals, indicated at 36. Let the first and the second time intervals be equal to 2 and 6 seconds, respectively. This means that the period of closing and opening of the shutter 30 is equal to 8 seconds. Such closing and opening operations of the shutter 30 are continued from the beginning of the sputtering to the end thereof.

With the thickness monitoring system, the target material sputtered from the target 22 deposits onto the quartz crystal 25 only during each first time interval 35. In other words, the quartz crystal 25 is intermittently exposed to a flow of particles traveling from the target 22. During each first time interval 35, the quartz crystal 25 is adversely affected by the high frequency produced by the voltage source 24 because the shutter 30 allows not only the target material but also a component of the high frequency to pass therethrough. Therefore, precise measurement is not possible during each first time interval 35. As a result, the quartz crystal 25 produces the electric signal widely and rapidly varied during each first time interval 35, as exemplified at 38 in FIG. 4. The electric signal is not accurately representative of a thickness of the monitoring layer.

On the other hand, the shutter 30 is closed during each second time interval 36. The target material and the high frequency component never reach the quartz crystal 25. The quartz crystal 25 produces the electric signal which is not subjected to any harmful influence of the high frequency component during each second time interval 36. Thus, the electric signal is accurately indicative of that thickness of the monitoring layer which is attached to the quartz crystal 25 during each first time interval 35 preceding each second time interval 36. This is clear from the fact that each thickness measured during each second time interval 36 is substantially invariable during each second time interval 36, as exemplified at 39 in FIG. 4.

In FIG. 4, a curve 41 is given by successively plotting the thicknesses of the monitoring layer which are measured during a succession of the first time intervals 35. From the curve 41, it is readily understood that the thicknesses measured during the first time interval succession are irregularly varied with time. Such an irregular variation is attributable to the influence of the high frequency produced by the voltage source 24. Another curve 42 (in fact, a straight line) shows a variation of thicknesses which are measured during a succession of the second time intervals 36. The curve 42 is substantially linearly variable and is not subjected to any influence of the high frequency. Thus, precise measurement is possible by monitoring the thicknesses of the monitoring layer during the second time intervals 36.

It should be mentioned here that each thickness of the monitoring layer measured during the second time intervals 36 is different from an actual thickness of the desired layer deposited on the substrate 18 because the quartz crystal 25 is exposed to the target 22 for a short time as compared with the substrate 18. However, it is readily possible to carry out calibration in consideration of tooling factors in order to make the actual thickness of the desired layer coincide with each thickness of the monitoring layer in a known manner. The illustrated detecting circuit 26 calculates the actual thickness of the desired layer with reference to the thickness of the monitoring layer and the tooling factors to indicate a result of calculation representative of the actual thickness.

The detecting circuit 26 can detect the completion or end of the sputtering by comparing the result of measurement with a final thickness and by detecting coincidence between the result of measurement and the final thickness.

Figure 5:
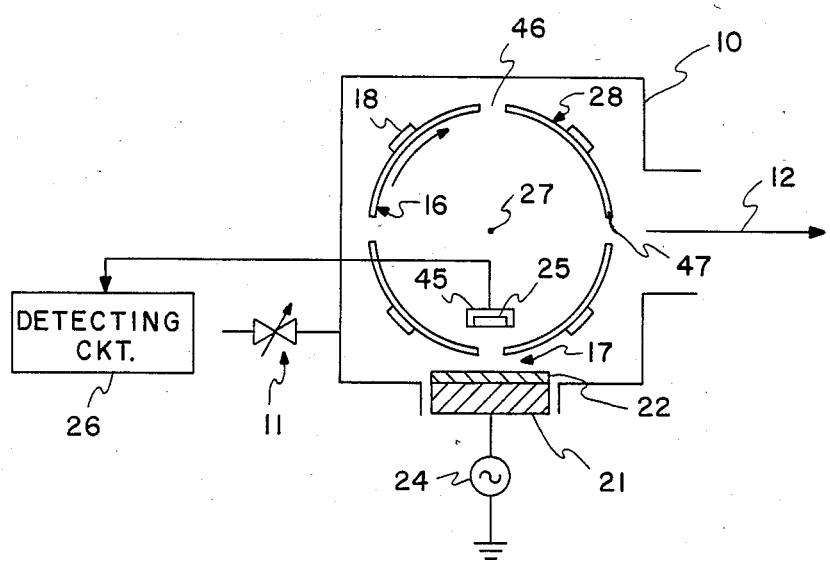
FIG. 5 shows a block diagram of a thickness monitoring system according to a second embodiment of this invention, together with a sputtering device similar to that illustrated in FIG. 2.

Referring to FIG. 5, a thickness monitoring system according to a second embodiment of this invention is for use in combination with a sputtering device which is similar to that illustrated in FIG. 2 and which comprises similar parts designated by like reference numerals. The thickness monitoring system comprises the quartz crystal 25 placed in the inside hollow space defined by the inside cylindrical surface of the cylinder 28. A support (symbolized at 45) is fixed to the chamber 10 to protrude into the hollow space and to support the quartz crystal 25. The quartz crystal 25 is opposed to the second electrode member 17 through the cylinder 28 by the support 45.

Four holes 46 are bored through the outside and the inside cylindrical surfaces on the cylinder 28 between two adjacent ones of the substrates 18 and are substantially azimuthally equally spaced from one another. Each hole 46 is defined by an internal side surface 47 contiguous to the outside and the inside cylindrical surfaces.

When the cylinder 28 is rotated around the axis 27 in the direction as shown at the arrow-headed curve, the crystal quartz 25 is periodically exposed to the second electrode member 17. As a result, the target material is intermittently deposited on the quartz crystal 25 during each first time interval 35' (FIG. 6) during which the quartz crystal 25 is opposite to the second electrode member 17 through each of the holes 46. On the other hand, no target material reaches the quartz crystal 25 during each second time interval 36' during which the quartz crystal 25 is sheltered from the second electrode member 17 by the cylinder 28. Accordingly, each hole 46 is similar in operation to the shutter 30 illustrated in FIG. 3 when the cylinder 28 is rotated. Thus, the internal side surface 47 distributed on the cylinder 28 may be called an exposing member for periodically or intermittently exposing the quartz crystal 25 to the second electrode member 17. As readily understood from FIG. 5, each of the first time intervals 35' alternates with each of the second time intervals 36'.

Figure 6:
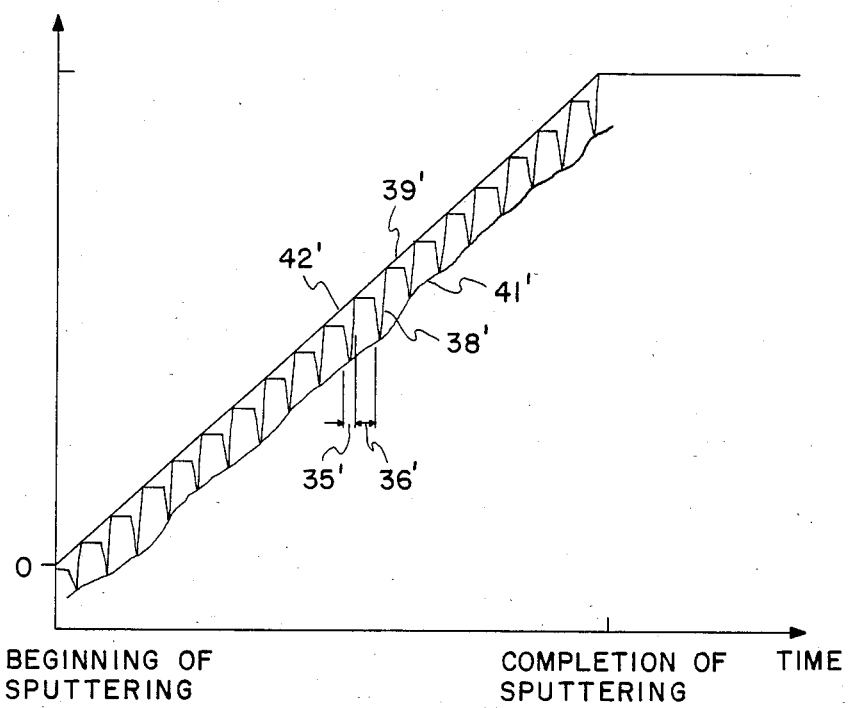
FIG. 6 shows a graphical representation for describing operation of the thickness monitoring device illustrated in FIG. 5.

Referring to FIG. 6 together with FIG. 5, it is assumed that the first and the second time intervals are equal to 0.5 second and 2.5 seconds, respectively. Inasmuch as the four holes 46 are distributed on the cylinder 28, the quartz crystal 25 is exposed to the second electrode member 17 a duration of 2 seconds during a complete rotation of the cylinder 28.

As is the case with FIG. 4, the electric signal produced from the quartz crystal 25 is indicative of each thickness of the monitoring layer rapidly variable during each first time interval 35', as exemplified at 38'. The thicknesses are irregularly varied during a succession of the first time intervals, as shown by a curve 41' given by connecting the thicknesses indicated during the first time intervals 35'.

During each of the second time intervals 36', the electric signal is indicative of a substantially invariable thickness, as exemplified at 39'. Another curve 42' which is given by connecting the thicknesses indicated during the second time intervals 36' is linearly varied with time.

It is therefore possible to detect the thickness of the desired layer by monitoring those thicknesses of the monitoring layer which are measured during the second time intervals 36', like in FIG. 3.

Inasmuch as each thickness of the monitoring layer measured during the second time intervals 36' is not equal to that of the desired layer deposited on each substrate 18, the detecting circuit 26 carries out calibration as is the case with the thickness monitoring system illustrated with reference to FIG. 3.

The completion of the sputtering can readily be detected by the detecting circuit 26 in a manner similar to that described in conjunction with FIG. 3.

Figure 7:
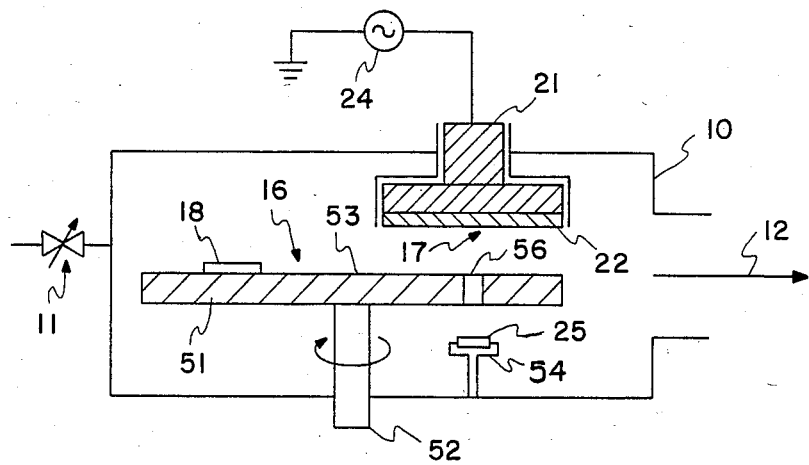
FIG. 7 shows a block diagram of a thickness monitoring system according to a third embodiment of this invention, together with a further sputtering device.

Referring to FIG. 7, a thickness monitoring system according to a third embodiment of this invention is for use in combination with a further sputtering device. The illustrated sputtering device is similar to that illustrated in conjunction with FIG. 1 except that the first electrode member 16 is rotatable. More specifically, the first electrode member 16 comprises a disk 51 comprising, in turn, a center axis 52 and a support surface 53 directed to the top of the figure. The support surface 53 is transverse to the center axis 52 and is rotatable therearound. The substrate 18 is supported on the support surface 53 and subjected to sputtering of the target material traveling from the target 22 when the substrate 18 is opposite to the second electrode member 17 during the rotation of the disk 51. For this purpose, the support surface is partially opposite to the second electrode member 17.

The quartz crystal 25 is supported by a support 54. The support 54 is placed behind of the support surface 53 relative to the second electrode member 17 so that the quartz crystal 25 is opposite to the second electrode member 17 through the disk 51.

An aperture is opened through the disk 51 and defined an internal disk surface. A plurality of apertures may be formed in the disk 51, although a single aperture 56 alone is illustrated in FIG. 7. Anyway, each aperture 56 is placed between the second electrode member 17 and the quartz crystal 25 to oppose the quartz crystal 25 to the second electrode member 17 through each aperture 56.

The quartz crystal 25 is exposed to the second electrode member 17 when the disk 51 is rotated around the center axis 52 and each aperture 56 is positioned between the second electrode member 17 and the quartz crystal 25. The internal disk surface defining each aperture 56 serves to periodically expose the quartz crystal 25 to the second electrode member 17 and is similar in operation to the internal side surface 47 illustrated in FIG. 5. Thus, the internal disk surface is operable in cooperation with the disk 51 as a shelter member for sheltering the quartz crystal 25 from the second electrode member 17.

Thus, the thickness of the desired layer deposited on the substrate can precisely be detected with the thickness monitoring system by monitoring the thickness of the monitoring layer on the quartz crystal without any influence of the high frequency.

Inasmuch as the target material is intermittently deposited on the quartz crystal 25 with the thickness monitoring system, it is possible to lengthen a life time of the quartz crystal 25.

While this invention has thus far been described in conjunction with a few embodiments thereof, it will readily be possible for those skilled in the art to put this invention into practice in various manners. For example, the first and the second time intervals described in conjunction with FIG. 3 may be selected at every sputtering device. In FIGS. 5 and 7, the number of the holes and the diameter thereof can be determined in consideration of characteristics of each sputtering device. Moreover, this invention is applicable to a d.c. sputtering device in order to protect the quartz crystal from being adversely affected by thermal energy radiated from the target. In addition, this invention is also suited to a vacuum evaporation device.

What is claimed is:

1. A thickness monitoring system for use in combination with a layer forming device which deposits a desired layer on a substrate in a hollow space filled with a gas, said thickness monitoring system being positioned for monitoring a thickness of said layer during the deposition thereof, said layer forming device comprising a first electrode member on which said substrate is supported in said hollow space, a second electrode member within said hollow space which is directed toward said first electrode member, and means for supplying an a.c. electrical voltage between said first and said second electrode members, said monitoring system comprising:
    a quartz crystal which is covered in said hollow space with a monitoring layer of a variable thickness and which produces an electrical signal having a frequency which is variable in correspondence to the thickness of said monitoring layer;
    exposing means in said hollow space for periodically exposing said quartz crystal to said second electrode member during each of a plurality of first time intervals, with said quartz crystal being shielded from said second electrode member during second time intervals which are interposed between two adjacent ones of said first time intervals; and
    thickness measuring means responsive to said electrical signal for periodically and successively measuring the thickness of said desired layer only during each of said second time intervals, said measuring being made with reference to the thicknesses of said monitoring layer which was formed during each of said first time intervals.

2. The thickness monitoring system as clailmed in claim 1, wherein said first and second electrodes have flat surfaces which are in a spaced parallel relationship, said first electrode member having a first flat principal surface which is opposite to and directed toward said second electrode member, said substrate being supported on said first flat principal surface, said quartz crystal facing said second electrode member in said hollow space outside a limited space defined by and between said substrate and said second electrode member, wherein said exposing means comprises:
    a shutter positioned between said quartz crystal and said second electrode member in the proximity of said quartz crystal; and
    means for periodically driving said shutter to intermittently expose said quartz crystal member to said second electrode.

3. The thickness monitoring system as claimed in claim 1, said first electrode member comprising a disk having a center axis and a support surface which is transverse to said center axis, said disk being rotatable around said center axis, said support surface being located on said disk at positions for supporting said substrate in locations which are directed toward said second electrode member, said thickness monitoring system further comprising:
    positioning means for positioning said quartz crystal on a side of said support surface which is between said crystal and said second electrode member so that said quartz crystal is normally shielded from said second electrode member by said disk;
    said exposing means further comprising:
    means formed in said disk for intermittently exposing said quartz crystal to said second electrode member when said disk is rotated.

4. A thickness monitoring system for use in combination with a layer forming device which deposits a desired layer on a substrate in a hollow space filled with a gas, said thickness monitoring system being positioned for monitoring a thickness of said layer during the deposition thereof, said layer forming device comprising a first electrode member on which said substrate is supported in said hollow space, a second electrode member within said hollow space which is directed toward said first electrode member, means for supplying an a.c. electrical voltage between said first and said second electrode members;
    said first electrode member having an axis and a cylinder which is rotatable around said axis, said cylinder having outside and inside cylindrical surfaces, said substrate being supported on said outside surface, said inside cylindrical surface being opposite said outside cylindrical surface and defining an inside hollow space,
    said monitoring system comprising:
    a quartz crystal which is covered in said hollow space with a monitoring layer of a variable thickness and which produces an electrical signal having a frequency which is variable in correspondence to the thickness of said monitoring layer;
    means for supporting said quartz crystal inside said hollow space so that said quartz crystal is directed toward said second electrode member which is outside said cylinder;
    exposing means in said hollow space for periodically exposing said quartz crystal to said second electrode member during each of a plurality of first time intervals, with said quartz crystal being shielded from said second electrode member during second time intervals which are interposed between two adjacent ones of said first time intervals; means distributed around said cylinder and extending through said outside and said inside cylindrical surfaces for intermittently exposing said quartz crystal to said second electrode member while said cylinder is rotated; and thickness measuring means responsive to said electrical signal for periodically and successively measuring the thickness of said desired layer only during each of said second time intervals, said measuring being made with reference to the thicknesses of said monitoring layer which was formed during each of said first time intervals.

5. The thickness monitoring system as claimed in claim 4, wherein said intermittently exposing means comprises:
  an internal side surface contiguous to said outside and said inside cylindrical surfaces for defining a hole therein for periodically exposing said quartz crystal to said second electrode member.

* * * * *